United States Patent
Kobayashi

(10) Patent No.: US 7,241,664 B2
(45) Date of Patent: Jul. 10, 2007

(54) ALIGNMENT MARK FORMING METHOD, SUBSTRATE IN WHICH DEVICES ARE FORMED, AND LIQUID DISCHARGING HEAD USING SUBSTRATE

(75) Inventor: Junichi Kobayashi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 82 days.

(21) Appl. No.: 10/935,107

(22) Filed: Sep. 8, 2004

(65) Prior Publication Data

US 2005/0070068 A1 Mar. 31, 2005

(30) Foreign Application Priority Data

Sep. 30, 2003 (JP) ............................. 2003-340193

(51) Int. Cl.
*H01L 23/544* (2006.01)
*H01L 21/76* (2006.01)

(52) U.S. Cl. ...................... 438/401; 438/462; 257/797; 257/E23.179

(58) Field of Classification Search ................ 438/401, 438/462; 257/797, E23.179, E21.024
See application file for complete search history.

(56) References Cited

U.S. PATENT DOCUMENTS

| | | | | |
|---|---|---|---|---|
| 6,309,943 | B1* | 10/2001 | Glenn et al. ................. | 438/401 |
| 6,329,265 | B1* | 12/2001 | Miyawaki et al. ........... | 438/401 |
| 6,688,732 | B2* | 2/2004 | Mitsuhashi et al. ............ | 347/70 |
| 6,750,076 | B2* | 6/2004 | Corso ........................... | 438/48 |
| 6,822,231 | B2* | 11/2004 | Schultz et al. .............. | 250/288 |
| 6,967,145 | B2* | 11/2005 | Tseng et al. ................. | 438/401 |
| 2002/0001051 | A1* | 1/2002 | Krusius et al. ............... | 349/73 |
| 2002/0175975 | A1 | 11/2002 | Mitsuhashi et al. ........... | 347/70 |
| 2003/0053058 | A1 | 3/2003 | Tanaka ........................ | 356/401 |

(Continued)

FOREIGN PATENT DOCUMENTS

JP 2003-92246 3/2003

(Continued)

OTHER PUBLICATIONS

Chinese Office Action dated Nov. 4, 2005, issued in corresponding Chinese patent application No. 200410078912.7.

(Continued)

*Primary Examiner*—M. Wilczewski
(74) *Attorney, Agent, or Firm*—Fitzpatrick, Cella, Harper & Scinto

(57) ABSTRACT

A method of manufacturing functional elements by forming a plurality of functional elements each having a through-hole piercing a surface on a substrate. The method includes the steps of forming an alignment mark on a surface of the substrate in an area in which the functional elements are constituted and the through-hole is formed in an additional process, forming an anti-etching layer on a reverse surface of the substrate, and providing on the reverse surface of the substrate a photomask having a pattern shape for forming the through-hole and a mark shape for registering the alignment mark and forming the through-hole by removing the etching layer corresponding to the through-hole. The mark shape is located at a position corresponding to a region where the through-hole is formed on the reverse surface of the substrate and is capable of being registered to the alignment mark. The method further includes the step of forming the through-hole by removing a portion, which is the through-hole, including the alignment mark, from the substrate.

17 Claims, 6 Drawing Sheets

U.S. PATENT DOCUMENTS

| | | |
|---|---|---|
| 2003/0129808 A1 | 7/2003 | Yang et al. ................. 438/424 |
| 2004/0195576 A1* | 10/2004 | Watanabe et al. ............. 257/79 |
| 2005/0090071 A1* | 4/2005 | Dower et al. ............... 438/401 |
| 2005/0208735 A1* | 9/2005 | Noma et al. ................ 438/460 |
| 2005/0282360 A1* | 12/2005 | Kida et al. ................. 438/462 |

OTHER PUBLICATIONS

Chinese Office Action dated Jun. 23, 2006, issued in corresponding Chinese patent application No. 2004-100789127, and English translation.

* cited by examiner

ALIGNMENT MARK FORMING METHOD, SUBSTRATE IN WHICH DEVICES ARE FORMED, AND LIQUID DISCHARGING HEAD USING SUBSTRATE

BACKGROUND OF THE INVENTION

1. Field of the Invention

The present invention relates to a method of forming an alignment mark used in a lithography process, a substrate in which devices are formed, and a liquid discharging head using the substrate.

2. Related Background Art

Photolithography technology used for the formation of a desired pattern in a semiconductor device manufacturing process, and the like, is one in which a resist is applied on the substrate to perform baking, the resist on the substrate is masked and exposed with a photomask in which the desired pattern formed on the substrate is formed, development of the resist is performed, and then a material to be etched is removed by etching to form the desired pattern on the substrate. In the semiconductor device manufacturing process, the exposure, the development, and the etching are repeatedly performed with various photomasks because a complicated pattern is formed on the substrate. Therefore, in order to perform alignment between the substrate, in which a certain pattern is already formed, and the photomask, which is of a subsequent pattern original plate, it is necessary that alignment marks necessary to an alignment process using image processing are arranged at positions where the alignment marks of the substrate and the photomask are opposite to each other.

As shown in FIG. 6, in the semiconductor device manufacturing process, it is a mainstream technique to form a plurality of desired product devices 1008 from a substrate 1001, referred to as a wafer, in a collective manner. In a case wherein the plurality of product devices 1008 is formed from the substrate 1001 in a collective manner, the alignment mark for the alignment is arranged in an area 1007 dedicated to the alignment mark, which is different from the portion which becomes the product devices 1008.

FIG. 7 is an enlarged view showing the area 1007 dedicated to the alignment mark in an area A of FIG. 6 when viewed from the lower surface side of the substrate 1001 shown in FIG. 6. As shown in FIG. 7, a "cross-shaped" substrate-side alignment mark 1002 is formed in the area 1007 dedicated to the alignment mark located in the upper surface of the substrate 1001. A resist pattern 1005 is formed in the lower surface of the substrate 1001. The resist pattern 1005 includes alignment mark traces 1005a, which are arranged at the positions corresponding to four corners of the cross-shaped substrate-side alignment mark 1002. As shown in FIG. 7, the alignment mark traces 1005a are formed at the upper-right, lower-right, upper-left, and lower-left positions of the alignment mark 1002 so as not to overlap the alignment mark 1002. FIG. 7 is a perspective view showing the substrate-side alignment mark 1002 of the upper surface of the substrate 1001.

The technique of arranging the alignment mark for the alignment in the area dedicated to the alignment mark, which is different from the portion which becomes the product devices, is well known, without citing technical references.

However, when the alignment mark 1002 for the alignment is arranged in the area 1007 dedicated to the alignment mark, which is different from the area which becomes the product devices 1008, a yield of the product device 1008 obtained from the substrate 1001 is decreased by a size of the area 1007. Because the individual product device 1008 is obtained by dicing the substrate 1001 in which the plurality of product devices 1008 is formed, even if the size of the alignment mark 1002 is smaller than the area of the individual product device 1008, the area of each alignment mark 1002, which is not used for the product device 1008, becomes equal to the area of each product device 1008. Therefore, the decrease in yield becomes remarkable as the area of the product device 1008 is increased.

On the other hand, in order to eliminate the area which is not used for the product device, there is a well-known technique in which the alignment mark for the alignment is arranged in the area dedicated to the alignment mark, which is different from the area which becomes the product devices, but the alignment mark is provided within the area of the product device itself.

However, in the technique, the area of the individual product device is increased by the area necessary to arrange the alignment mark, so that the yield of the product device cannot be increased much.

Therefore, recently, the technique of arranging the alignment mark in the area where the substrate is cut (usually referred to as a "scribe line") is used as one of the techniques of solving the problem that the yield of the product device is decreased due to the provision of the alignment mark. In accordance with the technique, since the alignment mark is given to the point which is cut in the dicing process, it is not necessary to separately reserve the area for the arrangement of the alignment mark on the substrate, which allows the substrate to be effectively utilized to increase the yield of the product device. For example, such a technique is described in Japanese Patent Application Laid-Open No. 2003-092246.

Referring to FIG. 8, this technique will be described. When a cutter (dicing blade) used for the cutting has a thickness of about 50 μm, the alignment mark 1002 can be arranged on a scribe line 1006 because of a fine rule of the current photolithography technology. However, in this case, since it is necessary to form more finely the alignment mark, it is necessary to use an apparatus which can perform the fine pattern forming with high accuracy, and such an apparatus is expensive. When the accuracy required for forming the alignment mark is higher than the accuracy required for forming the product device, manufacturing the product device with such accuracy leads to overspecifying the performance of the product device.

The above-described problem concerning the arrangement of the alignment mark remarkably appears when a through-hole piercing the substrate is particularly made as a necessary function of the product device. For example, in a process of manufacturing an ink jet recording head, ink discharging energy generation elements and nozzles are formed on a silicon (Si) substrate, and an ink supply port for supplying ink from the outside to each nozzle is caused to pierce the Si substrate. The through-hole is usually made by photolithography technology. In particular, Si anisotropic etching or dry etching with a reaction gas is used for making the through-hole. In either case, it is necessary to make the through-hole by performing the alignment between the ink supply port and a structure of the ink discharging energy generation element or nozzle, which is arranged in the substrate. However, the alignment mark formed on the Si substrate is also etched when the Si substrate is etched to make the through-hole. Therefore, sometimes, concave damage is generated in the portion where the alignment mark is formed in the Si substrate.

When the problem is solved by forming the alignment mark in the area which does not influence the area which becomes the product device, i.e., in the area dedicated to the alignment mark independent for the product device, as described above, the yield of the product device from the substrate is decreased by the area dedicated to the alignment mark.

When the technique of arranging the alignment mark on the scribe line 1006 is adopted, even if the alignment mark can be arranged on the scribe line 1006 in terms of size, since side etching (the etching spreads in a crosswise direction compared with the actual resist pattern) occurs from the portion where the alignment mark is formed during the etching, a defect is generated in the product devices arranged near four corners of the alignment mark. This is not preferable in regards to the quality of the product device.

Referring to FIG. 9, this phenomenon will be described. Assuming that the amount of side etching generated at the formation point of the alignment mark trace 1005a in the lower surface of the substrate 1001 is 50 μm in one side direction when the Si substrate 1001 is etched, the alignment mark trace 1005a has an original size of 50 μm by 50 μm (see FIG. 7) and a tilt angle of a <111> surface of the Si substrate 1001 by the Si anisotropic etching is 54.7°, so that, after the side etching, the portion where the alignment mark trace 1005a is formed becomes a groove 1009 having a shape of a quadrangular pyramid, in which an opening portion is 150 μm by 150 μm and a depth t is about 106 μm.

Broadening a width of the scribe line 1006 or forming more finely, the alignment is thought of as a technique of decreasing the influence of the side etching. However, the yield of the product device is decreased by the width of the scribe line 1006 when the width of the scribe line 1006 is broadened. When the alignment mark is formed more finely, there is a problem that the accuracy of the alignment is difficult to maintain in the fine alignment mark, while the cost of the alignment mark forming apparatus is increased. Particularly, in the semiconductor device manufacturing process, how much the yield of the product device is obtained from the wafer substrate largely influences the cost of the product device. Therefore, when the alignment mark used for the alignment between the substrate and the photomask is formed on the substrate, it is necessary to arrange the alignment mark so that the alignment mark decreases the yield of the product device.

SUMMARY OF THE INVENTION

It is an object of the invention to provide an alignment mark forming method, which enables the alignment mark used for the alignment between the substrate and the photomask to be arranged so as not to decrease the yield of the product device, the substrate in which the devices are formed by using the alignment mark forming method, and the liquid discharging head using the substrate.

It is another object of the invention to provide an alignment mark forming method in which, because the alignment mark is arranged in the area which forms the device of the substrate and is removed by a post-process, it is not necessary that an area dedicated to the arrangement of the alignment mark be provided, and the size of the device itself is not increased by the size of the alignment mark, the substrate in which the devices are formed by using the alignment mark forming method, and the liquid discharging head using the substrate.

It is still another object of the invention to provide an alignment mark forming method in which, in the method of forming the alignment mark used for the alignment between the substrate in which the plurality of devices is formed and the photomask for masking the resist in order to perform the patterning of the resist applied on the substrate by the photolithography process, the alignment mark is formed within the area, which is removed from the substrate during the post-process, which is treated to the substrate in the portion of the substrate where the devices are formed, the substrate in which the devices are formed by using the alignment mark forming method, and the liquid discharging head using the substrate.

DETAILED DESCRIPTION OF THE PREFERRED EMBODIMENTS

In the invention described in detail below, by forming the alignment mark within the area, which is removed from the substrate during the process, after the process being performed to the substrate, the alignment mark can be arranged without reducing the yield of the device from the substrate, and the miniaturization of the device itself can also be achieved.

Referring to the accompanying drawings, preferred embodiments of the invention will be described.

Figure 1:
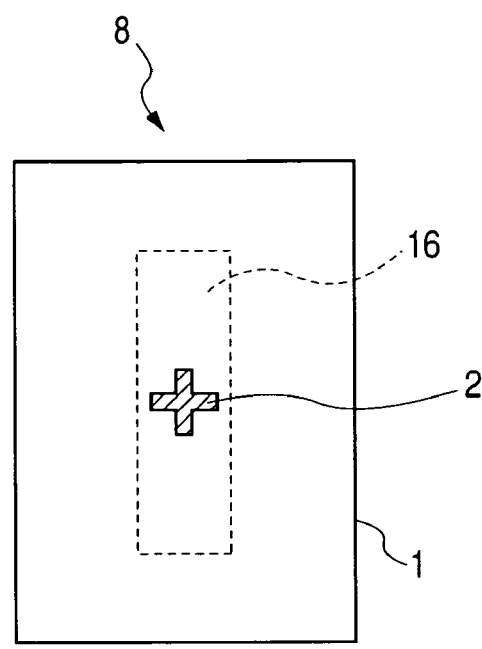
FIG. 1 is a plan view showing a schematic configuration of an embodiment of a device in a step in which the device is formed by applying the alignment mark forming method of the invention.
Figure 2:
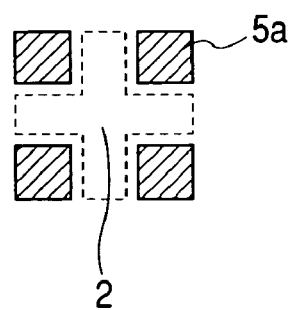
FIG. 2 shows a substrate in which a resist pattern is formed on a lower surface when viewed from a lower surface side.

FIG. 1 is a plan view showing a schematic configuration of an embodiment of the device in a step in which the device is formed by applying the alignment mark forming method of the invention. FIG. 2 is a perspective view showing a substrate-side alignment mark formed in the upper surface of the substrate shown in FIG. 1 and an alignment mark trace of the photomask masked on the lower surface of the substrate. FIG. 2 shows a substrate 1 in which a resist pattern 5 (see FIGS. 3A to 3F) is formed on the lower surface when viewed from the lower surface side.

As shown in FIGS. 1 and 2, in the device formed by applying the alignment mark forming method of the invention, the substrate-side alignment mark 2 is formed within the area (hereinafter referred to as "through-hole making area 6'") where a through-hole 6 (see FIGS. 3A to 3F) is made in the upper surface of substrate 1 during a post-process. In the lower surface of the substrate 1, an alignment mark trace 5a of the photomask, which is a part of the resist pattern 5, is formed at a position opposite to the substrate-side alignment mark 2. The substrate-side alignment mark 2 and the alignment mark trace 5a of the photomask are removed when the through-hole 6 is made in the through-hole making area 6' of the substrate 1.

FIG. 1 shows only a portion which becomes one product device 8 in the substrate 1. Actually, the substrate 1 has a size in which the plurality of product devices 8 can be formed. The individual product device 8, shown in FIG. 1, can be obtained by cutting the substrate 1 after forming the plurality of product devices 8 in the substrate 1.

In the photomask (not shown) used for the formation of the resist pattern 5 and alignment mark trace 5a in the lower surface of the substrate 1, as mentioned later, the resist is masked when the patterning is performed to the resist applied to the lower surface side of the substrate 1. The alignment of the photomask with respect to the substrate 1 is performed by positioning the photomask with position control utilizing image processing, so that the "cross-shaped" alignment mark 2 on the upper surface side of the substrate 1 is arranged in an alignment mark of the photomask, which is formed by arranging the four square alignment mark traces 5a at four corners, respectively. Specifically, the position control utilizing the image processing is performed such that an image of the substrate-side alignment mark 2 taken from the upper surface side of the substrate 1 and the image of the alignment mark of the photomask taken from the lower side of the substrate 1 are superimposed on each other with the image processing, and the position of the photomask is adjusted so that the alignment marks are brought into the correct positions.

Although the alignment mark 2 and the alignment mark of the photomask are formed in the above-described shapes in the embodiment, the shapes of the alignment marks are not limited to the embodiment.

Referring to FIGS. 3A to 3F, the process of forming the device by applying the alignment mark forming method of the invention will be described below.

Figure 3A:
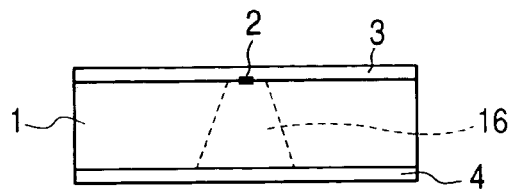
FIGS. 3A, 3B, 3C, 3D, 3E and 3F are views for explaining a process of forming the device by applying the alignment mark forming method of the invention.

As shown in FIG. 3A, a functional element (not shown) of the device and circuit wiring (not shown), which is made of a wiring material, such as aluminum and drives the functional element, are formed on the upper surface of the substrate 1 made of Si (silicon). In the upper surface of the substrate 1, during the formation of the functional element and the circuit wiring, the substrate-side alignment mark 2 is formed within a range of the through-hole making area 6', which is of the area where the through-hole 6 is made in the substrate 1. The substrate-side alignment mark 2 is made of the same material as that of the wiring material forming the circuit wiring. Thus, in forming the functional element, and the like, in the substrate 1, the simultaneous formation of the substrate-side alignment mark 2 can eliminate the requirement for the special process of providing the substrate-side alignment mark 2. The substrate-side alignment mark 2 is used when the photomask (not shown) masked on the lower surface of the substrate 1 in the later-mentioned process is aligned with substrate 1 with the position control utilizing the image processing.

FIGS. 3A to 3F also show only the portion which becomes one product device 8 in the substrate 1. Actually, the substrate 1 has a size in which the plurality of product devices 8 can be formed.

Then, as shown in FIG. 3A, while a passivation layer 3 is formed on the upper surface side of the substrate 1, an etching-resistant layer 4 is formed on the lower surface side of the substrate 1. The passivation layer 3 has functions of both a protective layer for protecting the functional element and circuit wiring, which are formed on the upper surface of the substrate 1 and a stop layer of an etchant in forming the through-hole 6 by wet etching. The passivation layer 3 is made of a material, such as SiN or P—SiO. The etching-resistant layer 4 is formed by a silicon thermal oxidation film, and the etching-resistant layer 4 is made of a material, such as SiN or $SiO_2$.

Figure 3B:
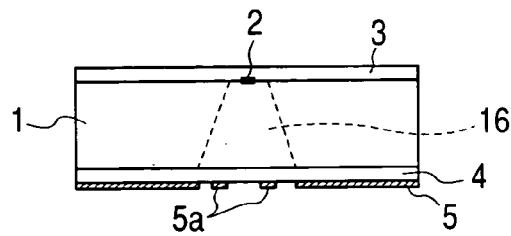

As shown in FIG. 3B, the resist pattern 5, including the alignment mark trace 5a of the photomask is formed on the etching-resistant layer 4 on the lower surface of the substrate 1. The formation of the resist pattern 5 is performed as follows:

First, the photoresist for forming the resist pattern 5 is applied on the etching-resistant layer 4. The photoresist is masked with the photomask (not shown) having the pattern shape formed on the substrate 1 and the alignment mark by aligning the photomask with the photoresist as described above, and then, the photoresist is exposed to perform development. Accordingly, the resist pattern 5 shown in FIG. 3B, including the alignment mark trace 5a of the photomask, is formed. The alignment mark trace 5a is located within the range of the through-hole making area 6' of the substrate 1.

Figure 3C:
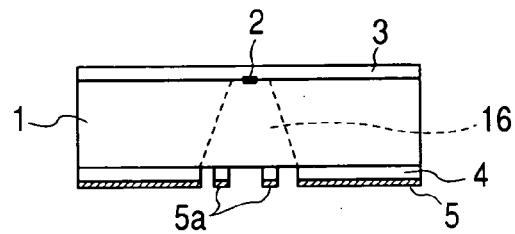
Figure 3D:
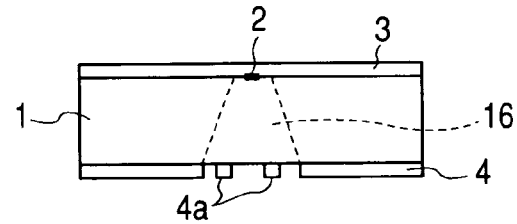

As shown in FIG. 3C, the patterning of the etching-resistant layer 4 is performed by wet etching using buffered hydrofluoric acid, which is commercially available. After the patterning of the etching-resistant layer 4, the resist pattern 5 and the alignment mark trace 5a are removed from the etching-resistant layer 4 (FIG. 3D). An alignment mark pattern 4a corresponding to the alignment mark trace 5a of the resist pattern 5 is formed in the etching-resistant layer 4.

Figure 3E:
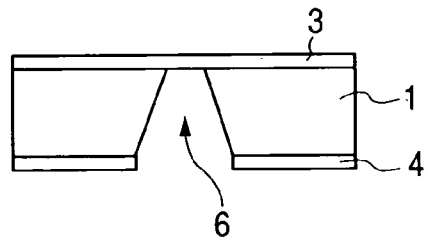

Then, the patterning is performed by etching the substrate 1. At this point, as shown in FIG. 3E, the through-hole 6 is made in the through-hole making area 6' of the substrate 1.

An anisotropic etching technique utilizing crystal orientation of Si and a plasma etching technique performed by introducing reaction gas in which $CF_4$, $H_2$, $O_2$, $N_2$, and the like, are mixed are known as an etching method of patterning the substrate 1. In the embodiment, it is possible to use these techniques. By way of example, the case in which the anisotropic etching technique is used as the etching method will be described below.

The Si anisotropic etching technique is one in which the etching is performed by utilizing a difference in etching rate between a <111> surface and a <100> surface of the crystal orientation when the wet etching is performed with the alkali etchant. In the embodiment, a 20 wt % KOH aqueous solution is used, and the etching is performed by dipping the substrate 1 into an etchant tank in which 20 wt % KOH aqueous solution is heated at a temperature of 80° C. It is also possible that TMAH (tetramethyl ammonium hydroxide), NaOH, and hydrazine are used as another etchant.

When the through-hole 6 is made by using the Si anisotropic etching technique, it should be noted that the size of the alignment mark pattern 4a of the etching-resistant layer 4 patterned in the shape of the alignment mark trace 5a is determined in consideration of the influence of side etching. In the Si anisotropic etching, generally, the Si substrate 1 is etched to be larger than the size of the mask of the etching-resistant layer 4 by the influence of the side etching. In the anisotropic etching of the embodiment, since the side etching phenomenon is also generated, it is necessary to determine the size of the alignment mark pattern 4a formed in the through-hole making area 6' of the etching-resistant layer 4 by previously grasping the amount of side etching.

The size of the alignment mark pattern 4a formed in the through-hole making area 6' of the etching-resistant layer 4 is formed to be smaller than the size of an aperture of the through-hole 6 of the post-side etching. Therefore, the alignment mark pattern 4a provided within the through-hole making area 6' of the etching-resistant layer 4 can be eliminated with no influence on the through-hole 6 by simultaneously etching the alignment mark pattern 4a in making the through-hole 6. In the embodiment, because of the size of the through-hole 6, when the size of the alignment mark pattern 4a formed in the through-hole making area 6' of the etching-resistant layer 4 is not more than 100 μm by 100 μm, the through-hole 6 can be made while the side etching influences the through-hole 6.

In the upper surface of the substrate 1, the substrate-side alignment mark 2 provided within the through-hole making area 6' is also eliminated in forming the through-hole 6 by the wet etching.

Figure 3F:
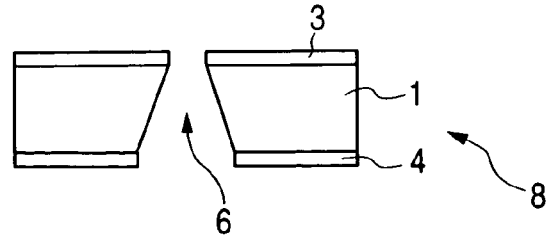

Finally, the portion of the passivation layer 3 opposite to the through-hole 6 is removed by the etching. Therefore, as shown in FIG. 3F, the through-hole 6, piercing the substrate 1 and the layers 3 and 4 on the upper and lower surfaces of the substrate 1, is formed. The individual product device 8 can be obtained by cutting the plurality of product devices 8 formed on the substrate 1 along a scribe line (not shown).

In the embodiment, the substrate-side alignment mark 2 and the alignment mark pattern 4a of the etching-resistant layer 4 can be eliminated with no influence on the formation of the through-hole 6 in making the through-hole 6 by arranging the substrate-side alignment mark 2 and the alignment mark pattern 4a of the etching-resistant layer 4 in the through-hole making area 6'. Therefore, it is not necessary that the area dedicated to the arrangement of the alignment mark be provided in the area different from the area where the product device 8 is located. Further, the area dedicated to the arrangement of the alignment mark is not provided in the product device 8, but the alignment mark is arranged in the area which is removed by the etching in forming the through-hole 6, so that the size of the product device 8 is not increased by the size of the alignment mark. As a result, in accordance with the embodiment, the alignment mark can be arranged so that the yield of the product device 8 is not decreased, and miniaturization of the product device 8 can be achieved.

Another Embodiment

Figure 4:
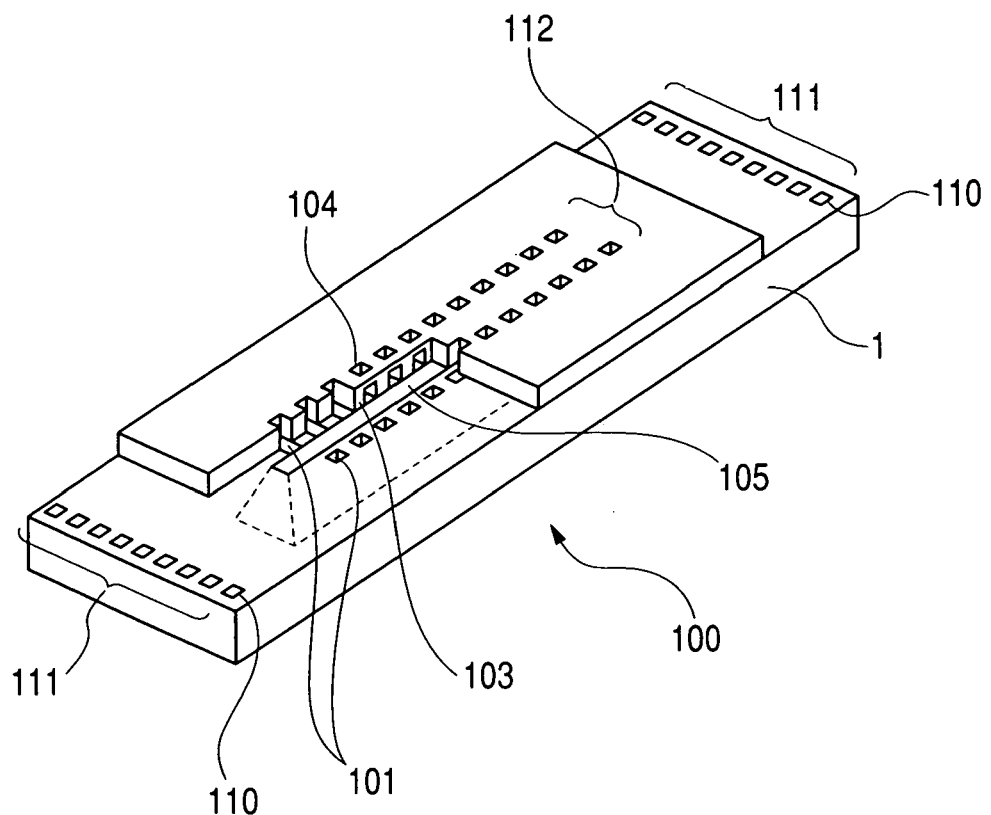
FIG. 4 is a perspective view showing an embodiment of an ink jet recording head formed by applying the alignment mark forming method of the invention, while a part of the ink jet recording head is cut away.

FIG. 4 is a perspective view showing an embodiment of an ink jet recording head formed by applying the alignment mark forming method of the invention, while a part of the ink jet recording head is cut away.

As shown in FIG. 4, an ink jet recording head 100 of the embodiment has the substrate 1 and a nozzle channel wall member 103 provided on the upper surface of the substrate 1. An ink discharging energy generation element 101, an electrode 110, and the like, are formed on the upper surface of the substrate 1. An ink supply port 105 piercing the substrate 1 is formed in the substrate 1. An ink nozzle 104, and the like, are formed in the nozzle channel wall member 103.

The ink supply port 105 extends in a lengthwise direction of the substrate 1, and the plurality of ink discharging energy generation elements 101 is arranged in two lines on both sides of the ink supply port 105 in the upper surface of the substrate 1. The plurality of electrodes 110 are provided near both ends in the lengthwise direction of the substrate 1, and these electrodes 110 are formed as a group of electrodes 111 in the proximity of each end portion, respectively.

The ink nozzle 104 formed in the ink channel wall member 103 is located above the ink discharging energy generation element 101 on the substrate 1. Therefore, similar to the ink discharging energy generation elements 101 on the substrate 1, a group of ink nozzles 112 formed by the ink nozzles 104 is formed in two lines.

A common liquid chamber (not shown) for tentatively storing ink supplied from an ink tank (not shown) is provided on the lower surface side of the substrate 1. The ink stored in the common liquid chamber is fed to an ink channel 106 (see FIG. 5E) formed by the nozzle 104 through the ink supply port 105, and the ink is supplied to surroundings of the ink discharging energy generation element 101 provided in accordance with each ink channel. When thermal energy generated by the ink discharging energy generation element 101 is given to the ink supplied to the surroundings of the ink discharging energy generation element 101, an ink droplet is discharged from the ink nozzle 104 due to pressure by growth of a bubble generated in the ink. The discharged ink droplet adheres to a recording medium (not shown) to record characters, images, and the like, in the recording medium.

The process of forming the ink jet recording head shown in FIG. 4 by applying the alignment mark forming method of the invention will be described below referring to FIGS. 5A to 5E.

Figure 5A:
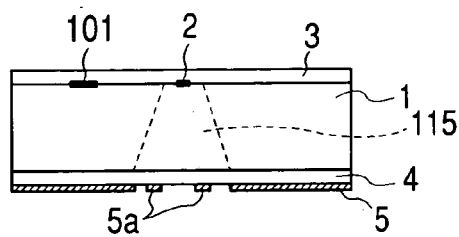
FIGS. 5A, 5B, 5C, 5D, and 5E are views for explaining a process of forming the ink jet recording head shown in FIG. 4 by applying the alignment mark forming method of the invention.

As shown in FIG. 5A, the ink discharging energy generation element 101, the electrode 110 (not shown in FIGS. 5A to 5E), and the circuit wiring (not shown), which is a mode of the wiring material, such as aluminum and drives the ink discharging energy generation element 101, are formed on the upper surface of the substrate 1 made of silicon. In the upper surface of the substrate 1, during the formation of the ink discharging energy generation element 101, the electrode 110, and the circuit wiring, the substrate-side alignment mark 2 is formed within the range of an ink supply port forming area 105', which is of the area where the ink supply port 105 is formed. The substrate-side alignment mark 2 is made of the same material as that of the wiring material forming the circuit wiring. The simultaneous formation of the substrate-side alignment mark 2 in forming the ink discharging energy generation element 101, and the like, in the substrate 1 can eliminate the requirement for the special process of providing the substrate-side alignment mark 2. The substrate-side alignment mark 2 is used when the photomask (not shown) masked on the lower surface of the substrate 1 in the later-mentioned process is aligned with substrate 1 with the position control utilizing the image processing.

FIGS. 5A to 5E show only the portion, which becomes one ink jet recording head 100, in the substrate 1. Actually, the substrate 1 has a size in which a plurality of ink jet recording heads 100 can be formed.

Then, as shown in FIG. 5A, while a passivation layer 3 is formed on the upper surface side of the substrate 1, an etching-resistant layer 4 is formed on the lower surface side of the substrate 1. The passivation layer 3 has the functions of both the protecting layer for protecting the ink discharging energy generation element 101 and circuit wiring, which are formed on the upper surface of the substrate 1 and the stop layer of the etchant in forming the ink supply port 105 by wet etching. The passivation layer 3 is made of a material such as SiN or P—SiO. The etching-resistant layer 4 is formed by a silicon thermal oxidation film and the etching-resistant layer 4 is made of a material such as SiN and $SiO_2$.

As shown in FIG. 5A, the resist pattern 5 including the alignment mark trace 5a of the photomask is formed on the etching-resistant layer 4 on the lower surface of the substrate 1. The formation of the resist pattern 5 is performed as follows:

First, the photoresist for forming the resist pattern 5 is applied on the etching-resistant layer 4. The photoresist is masked with the photomask (not shown) having the pattern shape formed on the substrate 1 and the alignment mark by aligning the photomask with the photoresist, as described above, and then, the photoresist is exposed to perform development. Accordingly, the resist pattern 5 shown in FIG. 5B, including the alignment mark trace 5a of the photomask, is formed. The alignment mark trace 5a is located within the range of the ink supply port forming area 105' of the substrate 1.

Figure 5B:
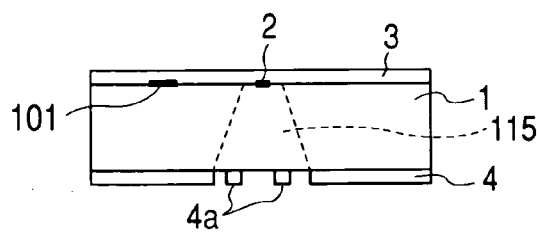

A shown in FIG. 5B, the patterning of the etching-resistant layer 4 is performed by wet etching using buffered hydrofluoric acid, which is commercially available. After the patterning of the etching-resistant layer 4, the resist pattern 5 and the alignment mark trace 5a are removed from the etching-resistant layer 4. The alignment mark pattern 4a, corresponding to the alignment mark trace 5a of the resist pattern 5, is formed in the etching-resistant layer 4.

Figure 5C:
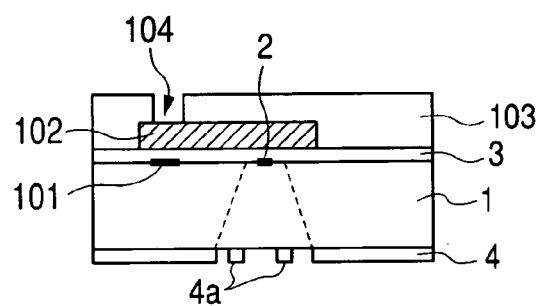

As shown in FIG. 5C, a template member 102 is formed on the passivation layer 103 on the upper surface side of the substrate 1, and then, the nozzle channel wall member 103 is formed on the substrate 1. The template member 102 is one which forms the ink channel 106 communicating the ink supply port 105 and the ink nozzle 104 to the nozzle channel wall member 103. The template member 102 is removed in the subsequent process. After the nozzle channel wall member 103 is provided so as to cover the whole of the template member 102 formed on the substrate 1, the portion of the nozzle channel wall member 103 is opened above the ink discharging energy generation element 101 of the substrate 1 by photolithography, to form the ink nozzle 104.

Figure 5D:
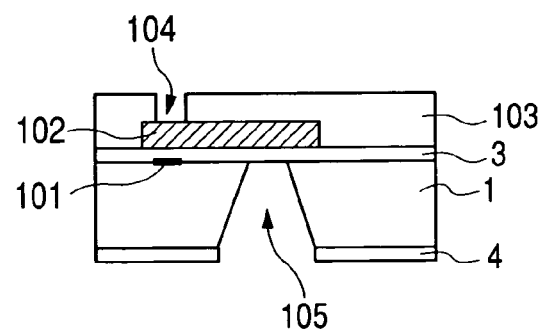

Then, the patterning is performed by etching the substrate 1. At this point, as shown in FIG. 5D, the ink supply port 105 is made in the ink supply port forming area 105' of the substrate 1. The anisotropic etching technique utilizing the crystal orientation of Si and the plasma etching technique performed by introducing reaction gas in which $CF_4$, $H_2$, $O_2$, $N_2$, and the like, are mixed, are known as the etching method of patterning the substrate 1. In the embodiment, it is also possible to use these techniques. Since a detailed description about the etching technique is similar to the description of FIG. 3E, the description of the etching technique will be omitted.

In the embodiment, the size of the alignment mark pattern 4a formed in the ink supply port forming area 105' of the etching-resistant layer 4 is formed to be smaller than the size of the aperture of the ink supply port 105 of the post-side etching. Therefore, the alignment mark pattern 4a provided within the ink supply port forming area 105' of the etching-resistant layer 4 can be eliminated with no influence on the ink supply port 105 by simultaneously etching the alignment mark pattern 4a in making the ink supply port 105. In the upper surface of the substrate 1, the substrate-side alignment mark 2 provided within the ink supply port forming area 105' is also eliminated in forming the ink supply port 105. The passivation layer 3 formed on the upper surface of the substrate 1 acts as the etching stop layer in the process of making the ink supply port 105 by the wet etching.

Figure 5E:
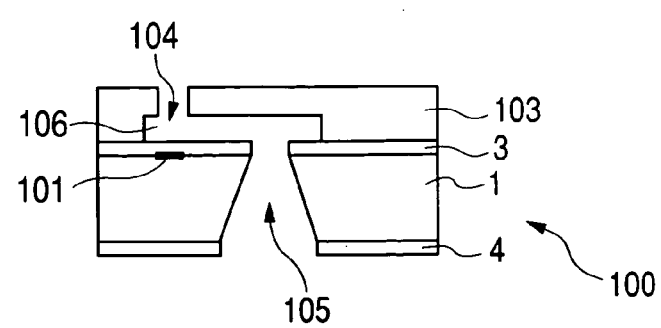
Figure 6:
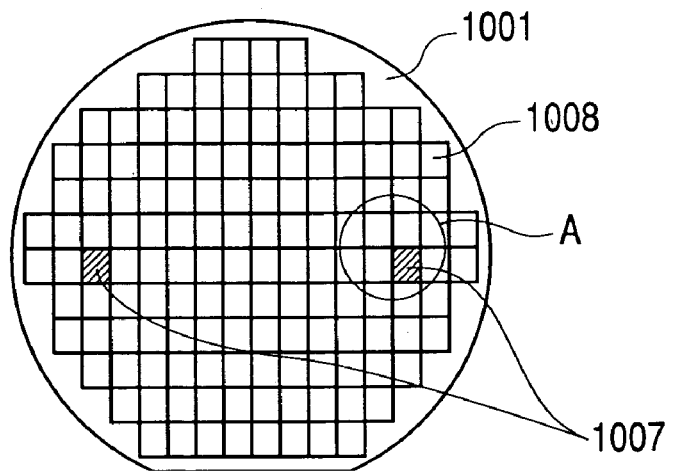
FIG. 6 is a view for explaining an example of a conventional process of manufacturing a semiconductor device.
Figure 7:
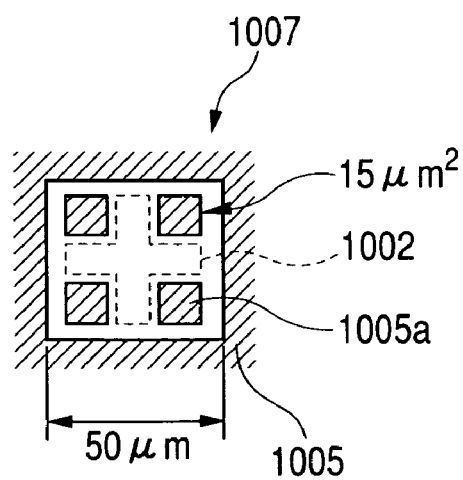
FIG. 7 is an enlarged view showing an area dedicated to the alignment mark in an area A of FIG. 6 when viewed from the lower surface side of the substrate shown in FIG. 6.
Figure 8:
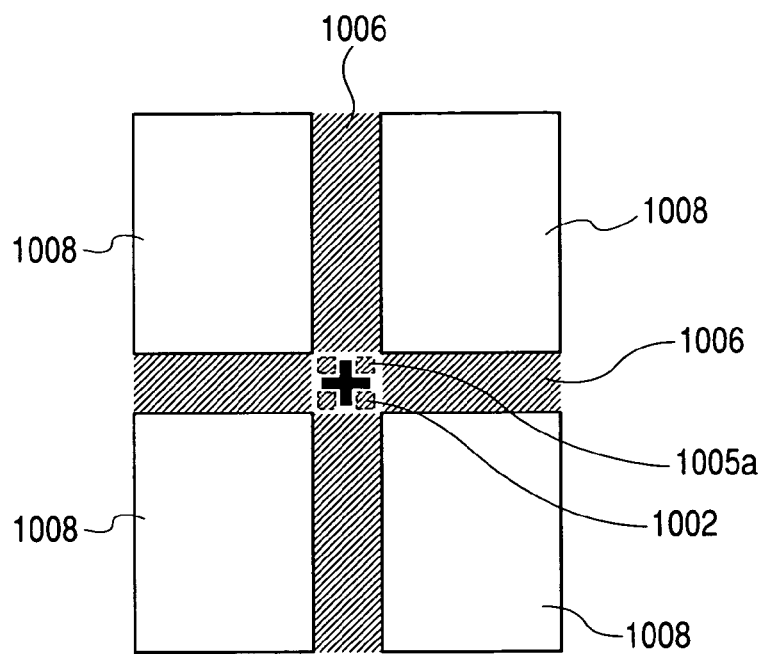
FIG. 8 is a view for explaining a conventional technique of arranging the alignment mark in a scribe line.
Figure 9:
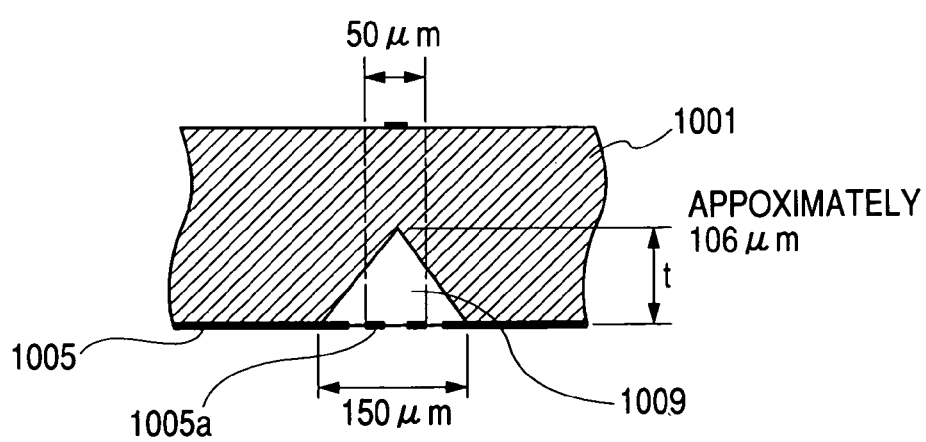
FIG. 9 is a view for explaining a side etching phenomenon.

Finally, the portion of the passivation layer 3 opposite to the ink supply port 105 is removed by the etching. Therefore, as shown in FIG. 5E, the ink supply port 105 piercing the substrate 1, and the layers 3 and 4 on the upper and lower surfaces of the substrate 1, is formed. After the ink supply port 105 is formed, the template member 102 is removed by dissolution with a dissolving solution. Therefore, the ink channel 106 communicating the ink supply port 105 and the ink nozzle 104 is formed in the nozzle channel wall member 103. The individual ink jet recording head 100 can be obtained by cutting the plurality of ink jet recording heads 100 formed on the substrate 1 along the scribe line (not shown).

In the embodiment, the substrate-side alignment mark 2 and the alignment mark pattern 4a of the etching-resistant layer 4 also can be eliminated with no influence on the formation of the ink supply port 105 in making the ink supply port 105 by arranging the substrate-side alignment mark 2 and the alignment mark pattern 4a of the etching-resistant layer 4 within the ink supply port forming area 105'. Therefore, it is not necessary that the area dedicated to the arrangement of the alignment mark be provided in the area different form the portion which becomes the ink jet recording head 100 of the substrate 1. Further, the area dedicated to the arrangement of the alignment mark is not provided in the product device 8, but the alignment mark is arranged in the area which is removed by the etching in forming the ink supply port 105, so that the size of the ink jet recording head 100 is not increased by the size of the alignment mark. As a result, in accordance with the embodiment, the alignment mark can be arranged so that the yield of the ink jet recording head 100 is not decreased, and miniaturization of the ink jet recording head 100 can be achieved.

Claim of Priority

This application claims priority from Japanese Patent Application No. 2003-340193, filed Sep. 30, 2003, which is hereby incorporated by reference herein.

What is claimed is:

1. A method of manufacturing functional elements by forming a plurality of functional elements each having a through-hole piercing a surface on a substrate, said method comprising the steps of:

forming an alignment mark on a surface of the substrate in an area in which the functional elements are constituted and the through-hole is formed in an additional process;

forming an anti-etching layer on a reverse surface of the substrate;

providing on the reverse surface of the substrate a photomask having a pattern shape for forming the through-hole and a mark shape for positioning the alignment mark, the mark shape being located at a position corresponding to a region where the through-hole is formed on the reverse surface of the substrate and capable of being positioned to the alignment mark;

forming an opening corresponding to the area and a portion corresponding to the mark shape by etching the anti-etching layer; and forming the through-hole by removing a portion, which is the through-hole, including the mark shape, from the substrate.

2. A method according to claim 1, wherein in said step of forming the alignment mark, the alignment mark is formed when the member constituting the functional elements is stored.

3. A method according to claim 2, wherein the member and the alignment mark are formed of the same material.

4. A method according to claim 1, wherein the through-hole is formed by applying an isotropic etching to silicon as the substrate.

5. A method according to claim 1, wherein a size of the mark shape is smaller than that of an opening of the through-hole at the reverse surface of the substrate.

6. A method of manufacturing a liquid discharge head including a discharge port for discharging liquid, a liquid channel communicated with the discharge port in order to supply the liquid to the discharge port, and an energy generation element for generating energy in order to discharge the liquid filled in the liquid channel from the discharge port, said method comprising the steps of:

forming an alignment mark on a surface of the substrate in an area in which a head device is constituted and a liquid supply port piercing the substrate is formed in an additional process;

forming an anti-etching layer on a reverse surface of the substrate;

providing on the reverse surface of the substrate a photomask having a pattern shape for forming the liquid supply port and a mark shape for positioning the alignment mark, the mark shape being located at a position corresponding to a region where the liquid supply port is formed on the reverse surface of the substrate and being capable of being positioned to the alignment mark;

forming an opening corresponding to the area and a portion corresponding to the mark shape by etching the anti-etching layer; and forming the liquid supply port by removing a portion, which is the liquid supply port, including the mark shape, from the substrate.

7. A method according to claim 6, wherein in said step of forming the alignment mark, the alignment mark is formed when the member constituting the functional elements is stored.

8. A method according to claim 7, wherein the member and the alignment mark are formed of the same material.

9. A method according to claim 6, wherein the liquid supply channel is formed by applying an anisotropic etching to silicon as the substrate.

10. A method according to claim 6, wherein a size of the mark shape is smaller than that of an opening of the liquid supply channel at the reverse surface.

11. A method according to claim 1, wherein in said step of forming the through-hole, the alignment mark is removed.

12. A method according to claim 6, wherein in said step of forming the through-hole, the alignment mark is removed.

13. A method of manufacturing a functional element by forming a functional element on a surface of a substrate, said method comprising the steps of:

forming an alignment mark on a surface of the substrate in an area in which the functional element is constituted, and a recess portion is formed from a reverse surface of the substrate in an additional process;

forming an anti-etching layer on the reverse surface of the substrate;

providing on the reverse surface of the substrate a photomask having a pattern shape for forming the recess portion and a mark shape for positioning the alignment mark, the mark shape being located at a position corresponding to a region where the recess portion is formed on the reverse surface of the substrate and capable of being positioned to the alignment mark;

forming an opening corresponding to the region and the mark shape by etching the anti-etching layer; and forming the portion penetrating the surface of the substrate.

14. A method according to claim 13, wherein in said step of forming the alignment mark, the alignment mark is formed when the member constituting the functional elements is stored.

15. A method according to claim 13, wherein the member and the alignment mark are formed of the same material.

16. A method according to claim 13, wherein the portion removed after alignment is formed by applying an isotropic etching to silicon as the substrate.

17. A method according to claim 13, wherein a size of the mark shape is smaller than that of an opening of the portion removed after alignment at the reverse surface of the substrate.

* * * * *